US010742176B2

(12) United States Patent
Suravarapu et al.

(10) Patent No.: US 10,742,176 B2
(45) Date of Patent: Aug. 11, 2020

(54) PROGRAMMABLE POWER COMBINER AND SPLITTER

(71) Applicant: MEDIATEK Singapore Pte. Ltd., Solaris (SG)

(72) Inventors: Ravikanth Venkata Suravarapu, Austin, TX (US); Caiyi Wang, Austin, TX (US)

(73) Assignee: MEDIATEK Singapore Pte. Ltd., Singapore (SG)

(*) Notice: Subject to any disclaimer, the term of this patent is extended or adjusted under 35 U.S.C. 154(b) by 0 days.

(21) Appl. No.: 16/162,075

(22) Filed: Oct. 16, 2018

(65) Prior Publication Data

US 2019/0149104 A1    May 16, 2019

Related U.S. Application Data

(60) Provisional application No. 62/585,604, filed on Nov. 14, 2017.

(51) Int. Cl.
| | |
|---|---|
| *H03F 1/56* | (2006.01) |
| *H03F 3/60* | (2006.01) |
| *H03F 3/72* | (2006.01) |
| *H01P 5/16* | (2006.01) |

(52) U.S. Cl.
CPC ............. *H03F 1/56* (2013.01); *H01P 5/16* (2013.01); *H03F 3/602* (2013.01); *H03F 3/72* (2013.01)

(58) Field of Classification Search
USPC .............................. 330/124 R, 295, 84, 286
See application file for complete search history.

(56) References Cited

U.S. PATENT DOCUMENTS

| | | | |
|---|---|---|---|
| 7,525,396 B2 * | 4/2009 | He | H03F 1/526 333/101 |
| 2002/0125944 A1 | 9/2002 | White et al. | |
| 2003/0090337 A1 | 5/2003 | Culliton et al. | |

(Continued)

FOREIGN PATENT DOCUMENTS

| | | |
|---|---|---|
| KR | 10 2006 0002689 A | 1/2006 |
| TW | I604692 | 11/2017 |
| WO | WO 2008/128508 A1 | 10/2008 |

OTHER PUBLICATIONS

Extended European Search Report dated Apr. 12, 2019 in connection with European Application No. 18205683.8.

(Continued)

*Primary Examiner* — Hieu P Nguyen
(74) *Attorney, Agent, or Firm* — Wolf, Greenfield & Sacks, P.C.

(57) ABSTRACT

Power combiners and splitters are commonly used as components for handling radio frequency (RF) signals. Disclosed herein are power combiner/splitters and methods to operate the same to reduce power loss when not all the ports are used. When an input/output port of a power combiner/splitter is unused or inactive, switches may be provided to cut off the port from the rest of the power combiner/splitter, which has programmable quarter-wave elements and resistors that are adjustable based on the number of remaining input/output ports that are active, such that in effect, the circuit operates similarly to a multi-way Wilkinson power combiner/splitter, and power loss due to inactive ports may be reduced or eliminated.

16 Claims, 8 Drawing Sheets

(56) References Cited

U.S. PATENT DOCUMENTS

2016/0112019 A1 4/2016 Blair et al.
2019/0081399 A1* 3/2019 Ku ..................... H01Q 1/2283

OTHER PUBLICATIONS

Kalis et al., A power divider/combiner block for switched beam arrays, ISIE 2002, Jul. 8, 2002, pp. 89-92.
Kim et al., Reconfigurable Power Divider and Combiner with Variable Power Ratio, 2004 IEEE MTT-S Microwave Symposium Digest, Jun. 6-11, 2004, vol. 1, pp. 57-60.
18205683.8, Apr. 12, 2019, Extended European Search Report.
Natarajan et al., A Fully-Integrated 16-Element Phased-Array Receiver in SiGe BiCMOS for 60-GHz Communications. IEEE Journal of Solid-State Circuits. May 2011; 46(5): 1059-75.
Wessel et al., Switchable Slow Wave Transmission Line in 130 nm SiGe Technology at 115 GHz for Phase Detection Based Biosensors. 2014 IEEE. 3 pages.
Chang et al., Design of 2.4-GHz CMOS Reconfigurable Dual-Function Switch Network and Its Application on Array Beamforming, Proceedings of the 39$^{th}$ European Microwave Conference, Sep. 29-Oct. 1, 2009, pp. 1018-1021.
Chung et al., Power routine scheme with dual operating modes: two-way Wilkinson divider and one-way signal path, Electronics Letters, Jan. 22, 2004, vol. 40, No. 2, 2 pages.
Kim et al., Reconfigurable 1:3 power divider using coupled lines, Electronics Letters, Oct. 22, 2009, vol. 45, No. 22, 2 pages.

* cited by examiner $$\begin{bmatrix} S_{11} & S_{12} & S_{13} \\ S_{21} & S_{22} & S_{23} \\ S_{31} & S_{32} & S_{33} \end{bmatrix} = \begin{bmatrix} 0 & \frac{-j}{\sqrt{2}} & \frac{-j}{\sqrt{2}} \\ \frac{-j}{\sqrt{2}} & 0 & 0 \\ \frac{-j}{\sqrt{2}} & 0 & 0 \end{bmatrix}$$

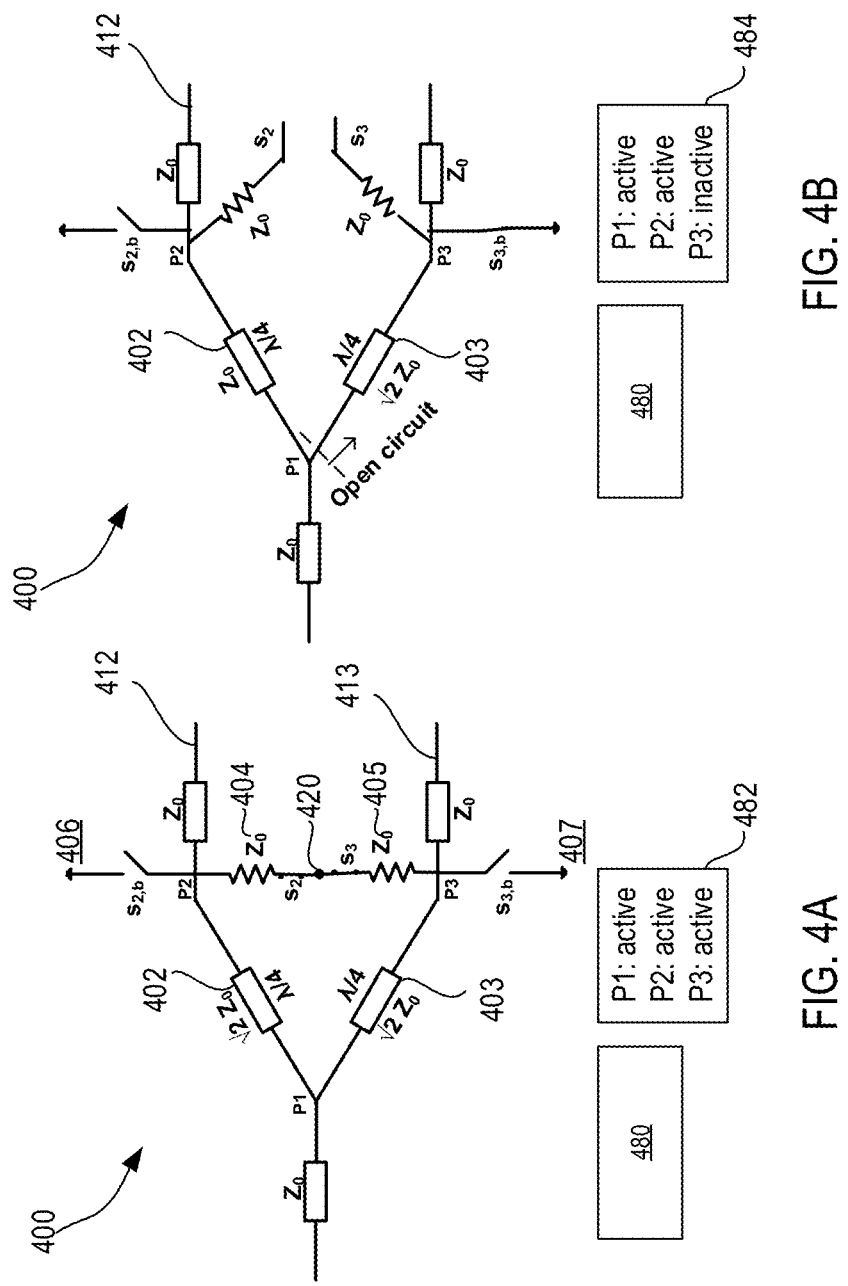

PROGRAMMABLE POWER COMBINER AND SPLITTER

CROSS-REFERENCE TO RELATED APPLICATIONS

This application claims the benefit under 35 U.S.C. § 119(e) of U.S. patent Application Ser. No. 62/585,604, filed Nov. 14, 2017, entitled "PROGRAMMABLE POWER COMBINER AND SPLITTER," which is hereby incorporated herein by reference in its entirety.

BACKGROUND

The present application relates generally to a power combiner and splitter apparatus, and methods of operating the same. In particular, it relates to a radio frequency (RF) power combiner and splitter circuitry.

A power combiner is typically used to receive electric signals at a plurality of input ports and generate a combined signal at a common port. A power splitter, also referred to as a divider, is typically used to receive an electric signal at a common port and generate a plurality of signals at a plurality of output ports. Power combiners and splitters are commonly used as components for handling radio frequency (RF) signals. A combiner/splitter may have one common port that serves as input for the splitter and output for the combiner, and a plurality of input/output ports that serve as outputs ports for the splitter, and inputs for the combiner.

One known power combiner/splitter architecture is the Wilkinson power combiner/splitter. FIG. 1A is a schematic diagram illustrating a two-way Wilkinson power combiner/splitter 100, while FIG. 1B shows its corresponding s-parameter matrix. Combiner/splitter has a common port P1, two input/output ports P2 and P3, and quarter wave elements 102 coupled between P1, P2 and P3. The input/output ports P2 and P3 are coupled with a resistor 104 having an impedance value of $2Z_0$. As a combiner, combiner/splitter 100 combines equal phase signals applied at the input ports P2, P3 into one signal at common port P1. As a splitter, combiner/splitter 100 splits the input signal at common port P1 into two equal phase and equal power signals at output ports P2, P3. Quarter wave ($\lambda/4$) element 102 may also be referred to as a 90° phase shift element and is configured to cause a 90° phase shift in a transmitted radio frequency signal. Quarter wave elements 102 may be transmission lines with characteristic impedance $Z=\sqrt{N} Z_0$ and length $\lambda/4$, where $\lambda$ is the wavelength of the electromagnetic wave propagating in the circuit, $Z_0$ is a characteristic impedance of the RF system connected to the P1, P2 and P3, and N is the number of input/output ports, or using lumped LC circuits which are equivalent to the transmission line with characteristic impedance $\sqrt{N} Z_0$ and length $\lambda/4$.

One advantage of the Wilkinson combiner/splitter is that all the ports are impedance matched and there is isolation between the input/output ports P2, P3 from the resistor 104. In an ideal Wilkinson splitter/combiner there is no power loss due to reflections and there is no power lost in the resistor 104 between P2 and P3.

FIG. 2A is a schematic diagram illustrating a generalized N-way Wilkinson power combiner/splitter 200, while FIG. 2B shows its corresponding s-parameter matrix. The N input/output ports P2 and P3 are each coupled with the common port P1 via quarter wave elements 102. Each input/output port is also coupled to each one of the rest of the input/output ports via resistors 204 having an impedance value of $Z_0$, where there are two resistors 204 serially connected in between a pair of input/output ports. Power combiner/splitter 200 works similarly to the 2-way power combiner/splitter 100, and has the advantage of matching for all ports and complete isolation between the N input/output ports $P_2, P_3, \ldots, P_{N+1}$. Therefore, for an ideal case there is no power loss due to reflections and there is no power lost in the resistors 204.

SUMMARY

According to some embodiments, a power combiner/splitter is provided. The power combiner/splitter comprises a common port; a plurality of input/output ports including a first input/output port and a second input/output port; a first quarter-wave element coupled between the common port and the first input/output port; a first switch coupled between the first input/output port and a reference voltage node; a second quarter-wave element coupled between the common port and the second input/output port; and a second switch coupled between the second input/output port and the reference voltage node.

According to some embodiments, a method of operating a power combiner/splitter is provided. The power combiner/splitter a common port and a plurality of input/output ports including a first input/output port and a second input/output port; a first quarter-wave element coupled between the common port and the first input/output port; a first switch coupled between the first input/output port and a reference voltage node; a second quarter-wave element coupled between the common port and the second input/output port; a second switch coupled between the second input/output port and the reference voltage node. The method comprises indicating, with a port activation information, a status of each of the plurality of input/output ports as active or inactive; determining, based on the port activation information, whether a status of the first input/output port changes from active to inactive; in response to the determination that the status of the first input/output port changes from active to inactive, coupling the first input/output port to the reference voltage node by closing the first switch.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 4A is a schematic diagram showing a two-way power combiner/splitter 400, according to embodiments of the present application;

FIG. 4B is a schematic diagram showing the configuration of two-way power combiner/splitter 400 when one of the input/output ports is reconfigured to be inactive, in accordance with some embodiments;

DETAILED DESCRIPTION

The inventors have recognized and appreciated that the Wilkinson power combiner/splitter as known in the prior art will only achieve lossless operation in the ideal case when the input/output ports are all used to connect to external loads with matching impedance that equals to a characteristic impedance $Z_0$. In practice, there are situations where not all the ports of a power combiner/splitter will be used for combining/splitting power. For example, one or more ports may be unused or deactivated. In one scenario, multiple input/output ports may be coupled to antennas of an antenna array for receiving/transmitting signals, while not all antennas in the antenna array may be active at all times. Some antennas may be configured to be unused or inactive, for example in a particular beam forming configuration. Thus the corresponding ports of a power combiner/splitter that normally connect to such antennas are no longer active for the purpose of combining/splitting power. According to an aspect of the present application, a port activation information may be provided to indicate which one or more input/output ports are active or inactive at a particular time. When used as a power splitter, ports are usually terminated with a load that matches the characteristic system impedance $Z_0$, but there will be power loss in the inactive ports that are not connected to a load. Similarly, when used as a power combiner with multiple input ports when one or more input ports are inactive, there will be power loss in the resistors $Z_0$ of a Wilkinson power combiner/splitter.

Figure 3:
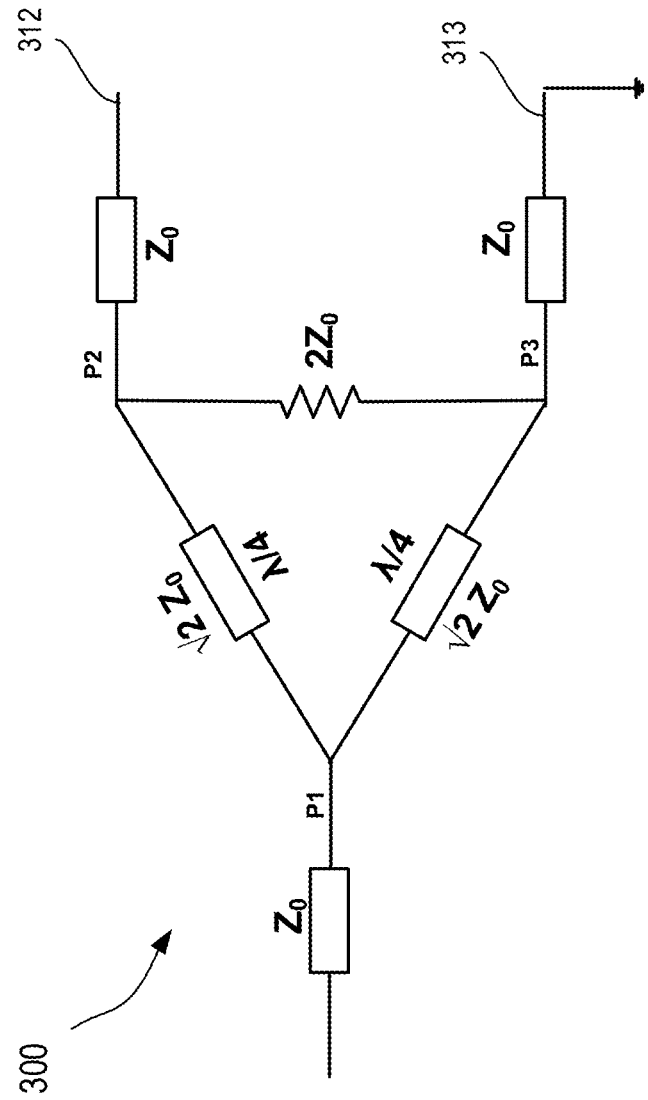
FIG. 3 shows a schematic diagram of a 2-way combiner/splitter 300 where not all ports are used and active, in accordance with some embodiments.

To illustrate such a problem, FIG. 3 shows a schematic diagram of a 2-way combiner/splitter 300 where not all ports are used and active, according to some embodiments. In the figure, all ports P1, P2 and P3 are shown as having a system impedance $Z_0$ to ground, which may represent the impedance of the circuitry, traces and transmission lines that physically connect to the ports. As shown in the scenario in FIG. 3, only ports P1 and P2 are active. For example, P2 is further used to couple to a load impedance 312. Port P3, however, is inactive and in this example is terminated to ground 313, instead of being used to further couple to a load impedance that matches system impedance $Z_0$. The inventors have recognized and appreciated that when a signal is applied to port P1, half the power will be delivered at port P2 and the remaining half of the power is dissipated in port P3. Meanwhile, there is no power dissipation in the resistor $2Z_0$. On the other hand, when a signal is applied to port P2, only half of the power is delivered to port P1 and the remaining half of the power is dissipated in the resistor $2Z_0$. Meanwhile, there is no power dissipation at port P3 due to port to port isolation. Therefore it is desirable to reduce or eliminate such a power loss when one or more input/output ports of a power combiner/splitter are unused.

Aspects of the present application address the above shortcoming of the power combiner/splitter when not all the ports are active. The inventors have recognized and appreciated that when a configuration is changed such that a status for an input/output port changes from active to inactive, switches may be provided to cut off the input/output port from the rest of the power combiner/splitter.

Further according to an aspect, when one of the input/output port is configured to be inactive, programmable quarter-wave elements and resistors are provided in the power combiner/splitter that are adjusted based on the number of remaining k active input/output ports that are active, such that in effect, the circuit operates similarly to an k-way Wilkinson power combiner/splitter operating under ideal condition for the input/output ports that are coupled to load impedances. As a result, power loss due to the unused or inactive ports may be reduced or eliminated.

As used herein, a power combiner/splitter may refer to a circuitry for power combiner that may also function in the reverse as a splitter, although it is not a requirement that a power combiner/splitter be able to function both ways. A power combiner/splitter may refer to a circuitry that primarily functions as a power combiner, or a circuitry that primarily functions as a power splitter. A port may also be referred to as nodes, connection points or terminals. A port may be a physical connection point internal or to a circuit, or may be a voltage node in a circuit.

According to an aspect of the present application, a switch of a first type may be provided between respective individual ports of N input/output ports of a power combiner/splitter and a reference voltage node. The switch of a first type is configured to be closed when the input/output port is not being used to couple to a load impedance, or being inactive. In some embodiments, the reference voltage node may be a ground node. Further according to the aspect of the present application, a switch of a second type may be provided between the input/output port and each one of the remaining input/output ports that are designated as active, the switch of the second type configured to be open when the input/output port changes its status from active to inactive. In some embodiments, the switch of a second type may be coupled between the input/output port and a common node between the input/output port and each one of the remaining input/output ports that are active. By closing the switch of the first type and opening the switch of the second type, the input/output port that is inactive may be cut off from the rest of the power combiner/splitter circuit. According to yet another aspect, the quarter-wave elements have programmable impedances and are adjusted such that their impedance are about $Z=\sqrt{k}\ Z_0$, wherein $Z_0$ is a characteristic impedance, and k is the number of input/output ports that are active and are expected to be coupled to a load impedance. When all input/outputs are configured to be in use or active, $k=N$. If one port becomes inactive, k becomes $N-1$. $Z_0$ may have any suitable value for a radio frequency application, and may be in a range of 25 to 200, or 50 to 100 Ohm inclusive.

Figures 1A, 1B:
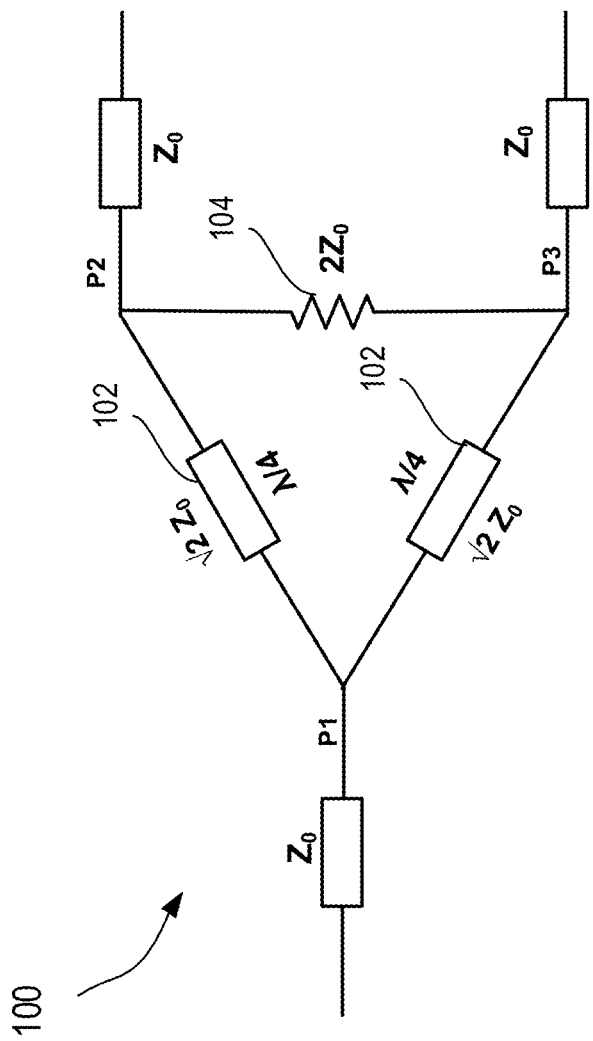
FIG. 1A is a schematic diagram illustrating a two-way Wilkinson power combiner/splitter 100.
FIG. 1B shows an s-parameter matrix corresponding to the two-way Wilkinson power combiner/splitter of FIG. 1A.
Figures 2A, 2B:
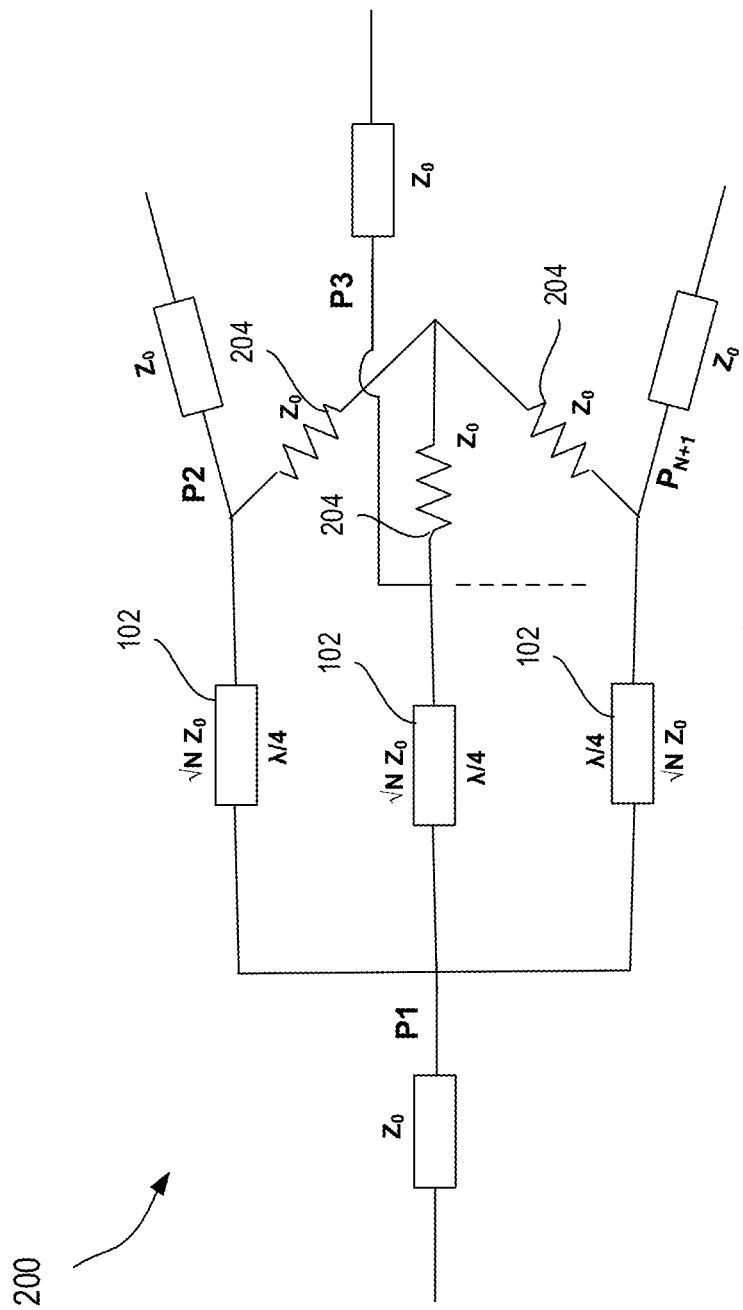
FIG. 2A is a schematic diagram illustrating an N-way Wilkinson power combiner/splitter 2.
FIG. 2B shows an s-parameter matrix corresponding to the N-way Wilkinson power combiner/splitter of FIG. 2A.

FIG. 4A is a schematic diagram showing a two-way power combiner/splitter 400, according to some aspects of the present application. Power combiner/splitter 400 differs from the two-way Wilkinson power combiner/splitter 100 in FIG. 1A in that a first switch $S_{3,b}$ and a second switch $S_{2,b}$ are provided between respective input/output ports P3, P2 and reference voltage nodes 407, 406. In some embodiments, reference voltage nodes 407, 406 are ground nodes.

It should be appreciated that ground nodes may be physical connection points that are connected to a reference ground voltage, or may be voltage nodes having the same voltage potential as a reference ground voltage.

A third switch S3 is serially connected with a first resistance 405, and both are disposed between P3 and a common node 420. A fourth switch S2 is serially connected with a second resistance 404, and both are disposed provided between P2 and the common mode 420. Quarter-wave elements 402 and 403 each has a programmable impedance. A controller 480 is provided and configured to control switching of switches $S_{2,b}$, $S_{3,b}$, $S_2$, and $S_3$ through suitable control connections (not shown), as well to adjust the programmable impedances of quarter-wave elements 402 and 403.

As shown in FIG. 4A, load 412 and 413 are each coupled to ports P2, P3. As both P2 and P3 are used for coupling to a load, switches $S_{2,b}$, $S_{3,b}$ are open while S2 and S3 are closed, such that the circuit 400 operates similarly to an ideal two-way Wilkinson power combiner/splitter.

A port activation information 482 may be provided in the power combiner/splitter 400 to indicate the status of the common port P1 and the two input/output ports P2 and P3. In the example shown in FIG. 4A, all three ports are active as indicated by port activation information 482. Port activation information 482 may be stored on a memory within power combiner/splitter 400. In some embodiments, port activation information 482 may be part of controller 480. Port activation information 482 may be stored as any suitable form of data structure. For example, port activation information 482 may comprise one or more index bits corresponding to each port of the power combiner/splitter, and may use one or more bits to represent a status of each port as active or inactive, although any other suitable designation of port status may be used. Depending on the intended configuration of the power combiner/splitter, port status within the port activation information 482 may be updated internally by controller 480, externally through user input, or via instructions received from other electronic components that are in communication with the power combiner/splitter 400.

FIG. 4B is a schematic diagram showing the configuration of two-way power combiner/splitter 400 when the status of one of the input/output ports is changed to be inactive, according to some embodiments. In FIG. 4B, the power combiner/splitter is configured to use ports P1 and P2 only, and to no longer use P3. A port activation information 484 indicates that the status for port P3 changes from active as shown in FIG. 4A, to inactive. In response to the indication of change in status of port P3 to inactive, controller 480 opens switch $S_3$, closes switch $S_{3,b}$ to couple port P3 to ground and to isolate port P3 from port P2. It should be appreciated that because switches $S_2$ and $S_3$ are connected in series between ports P3 and P2, it is not necessary to open $S_2$ in order to isolate P3 from P2, when $S_3$ is opened. In some embodiments, switch S2 may be optional, and there may be only one single switch between two input/output ports of a two-way power combiner/splitter that can be opened when one of the input/output ports becomes inactive.

Because a transmission line of length λ/4 presents a high impedance on the input side when its output load is shorted, shorting P3 to ground has the effect of making port P3 appear as an open circuit and have a very high impedance when viewed from P1. Controller 480 further configures quarter-wave element 402 coupled to the port P2 to change its impedance from $Z=\sqrt{2}\ Z_0$ to $Z_0$. As a result, P1 has matching impedance with P2 and there is little to no power loss between P1 and P2.

Programmable quarter-wave elements 402, 403 may be implemented with any suitable technique known in the art, for example by using lumped elements that have adjustable characteristic values. Programmable quarter-wave element may also be implemented using programmable transmission lines, for example with programmable microstrip lines known in the field, or programmable co-planar wave guides.

Figure 5A:
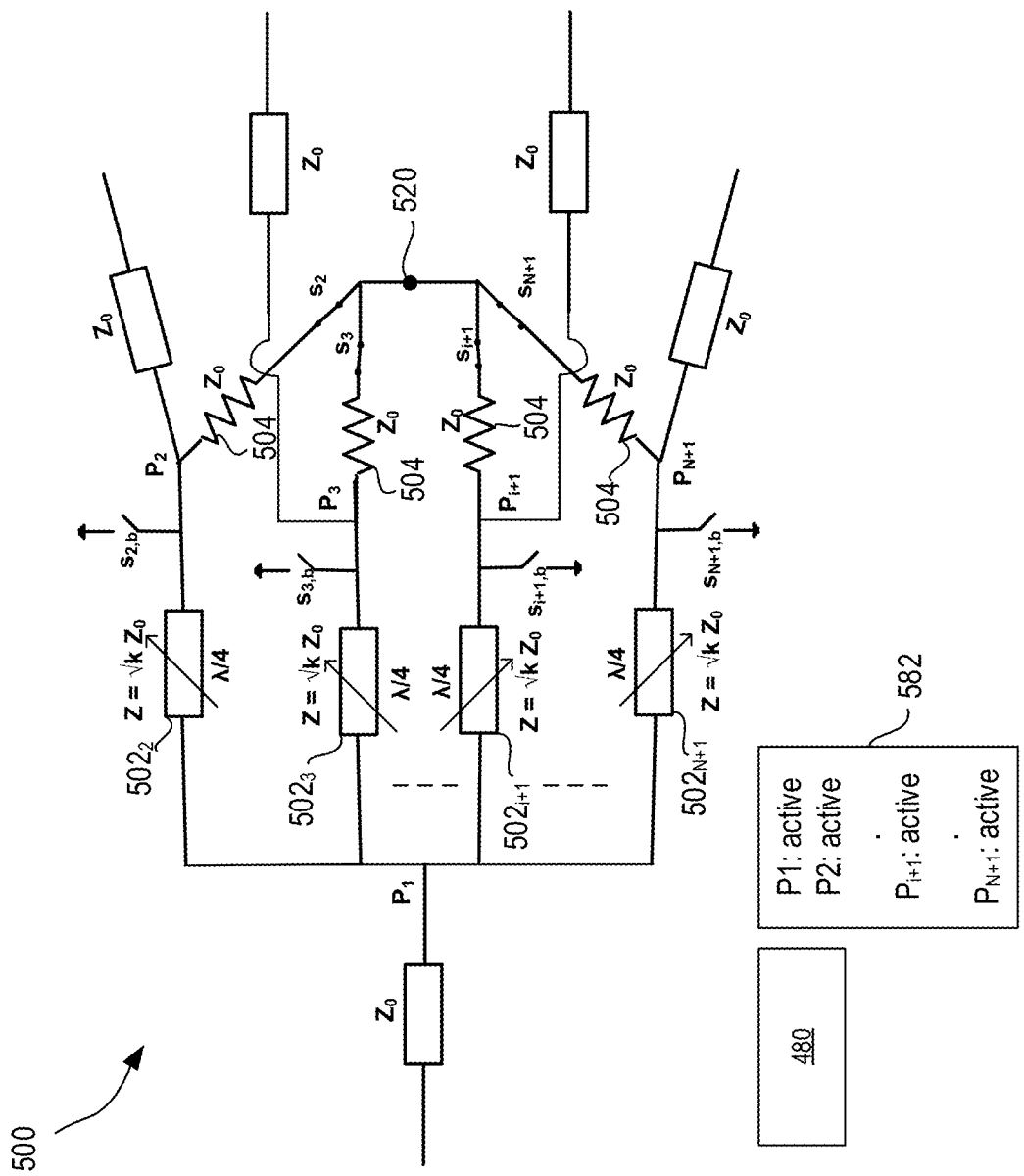
FIG. 5A is a schematic diagram showing an N-way power combiner/splitter 500, according to some aspects of the present application.

FIG. 5A is a schematic diagram showing an N-way power combiner/splitter 500, according to some aspects of the present application. In FIG. 5A, a first type of switches $S_{2,b}$, $S_{3,b}$, ... $S_{N+1,b}$ are provided between respective input/output ports $P_2$, $P_3$ ... $P_{N+1}$ and ground, a second type of switches $S_2$, $S_3$, ... $S_{N+1}$ are provided between one of the input/output ports and another one of the input/output ports. In particular, as shown in FIG. 5A, each second type of switches $S_2$, $S_3$, ... $S_{N+1}$ is coupled between a port of the N input/output ports, and a common node 520. Resistance 504 has an impedance value of $Z_0$, and is coupled in between a port of the N input/output ports, and the common node 520, and is in series with a respective switch of the second type $S_2$, $S_3$, ... $S_{N+1}$. A controller 480 is provided to control first type switches $S_{2,b}$, $S_{3,b}$, ... $S_{N+1,b}$, second type switches $S_2$, $S_3$, ... $S_{N+1}$, as well as programmable quarter-wave elements $502_2$, $502_3$, ... $502_{N+1}$. Port activation information 582 are provided and comprises indications of port status for each of the ports $P_1$, $P_2$, $P_3$ ... $P_{N+1}$.

As shown in the embodiment in FIG. 5A, when all the input/output ports $P_2$, $P_3$ ... $P_{N+1}$ are active, for example being used in a load network, the N first type of switches $S_{2,b}$, $S_{3,b}$, ... $S_{N+1,b}$ are kept open, second type of switches $S_2$, $S_3$, ... $S_{N+1}$ are kept closed, each of the quarter-wave elements $502_2$, $502_3$, ... $502_{N+1}$ has an impedance of $Z=\sqrt{k}\ Z_0$, with k=N. The operation and performance of power combiner/splitter 500 in such a scenario is similar to those of an N-way Wilkinson power combiner/splitter.

Figure 5B:
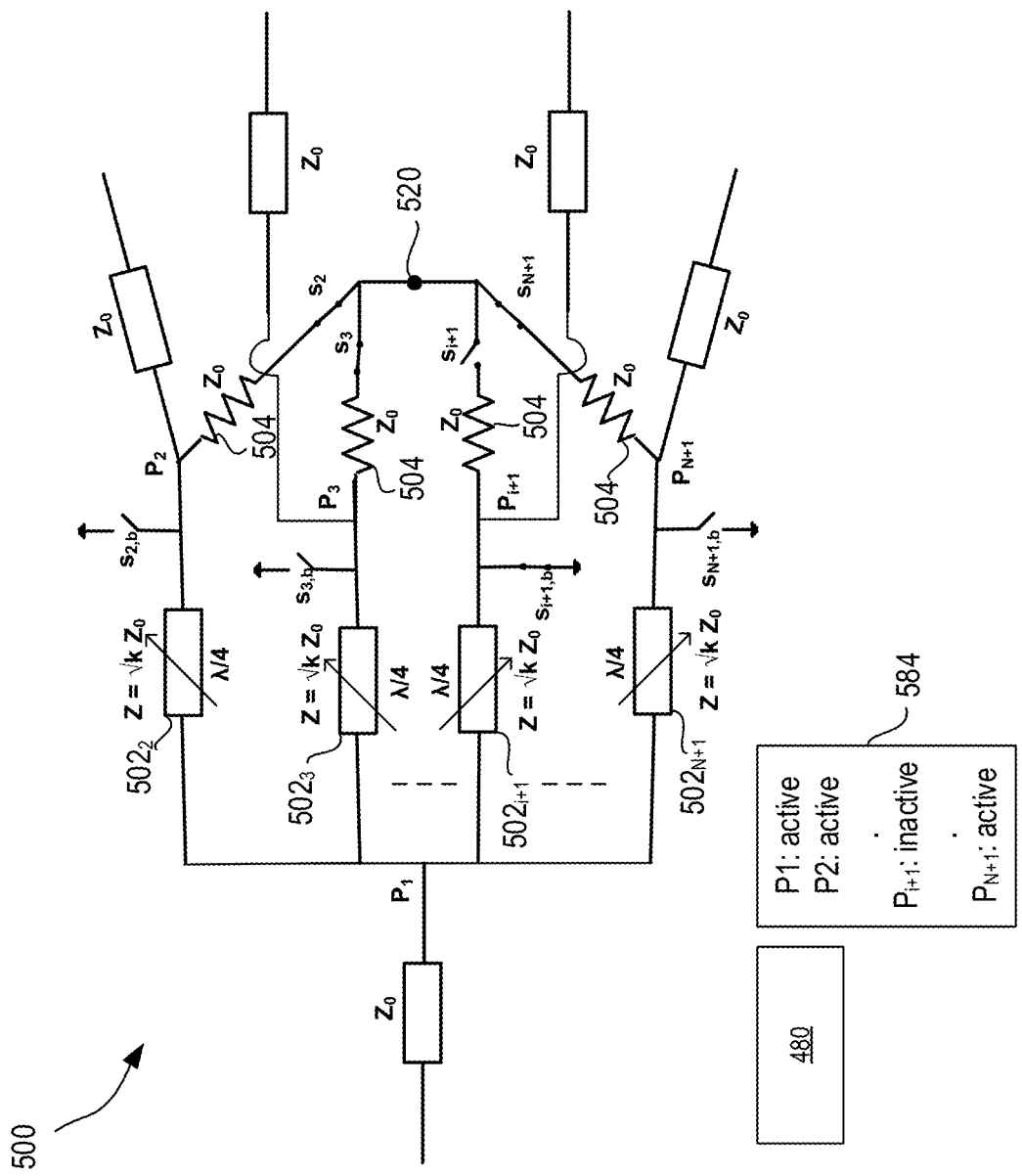
FIG. 5B is a schematic diagram showing the configuration of N-way power combiner/splitter 500 when one of the input/output ports is reconfigured to be inactive, according to some aspects of the present application.

FIG. 5B is a schematic diagram showing the configuration of N-way power combiner/splitter 500 when one of the input/output ports is reconfigured to be inactive. As shown in FIG. 5B, when one of the input/output port $P_{i+1}$ changes its status from active to inactive, as indicated in the port activation information 584, controller 480 responds by controlling the corresponding second type switch $s_{i+1}$ to be opened and the corresponding first type switch $s_{i+1,b}$ to be closed. This causes the load of the quarter-wave element $502_{i+1}$ connected between ports $P_1$ and $P_{i+1}$ to be shorted to ground on the $P_{i+1}$ node and hence causes a high impedance on the $P_1$ side of the quarter-wave element $502_{i+1}$. With this programmable configuration, there is no power loss in the port $P_{i+1}$ or the corresponding resistor $Z_0$ for which the corresponding second type switch $S_{i+1}$ is opened up.

Controller 480 is also configured to adjust each quarter-wave element to have a characteristic impedance $Z=\sqrt{k}\ Z_0$ based on the number of ports 'k' that is equal to the number of input/output ports that are indicated as active in port activation information 582. In this example shown in FIG. 5B, k becomes N−1.

Figure 6:
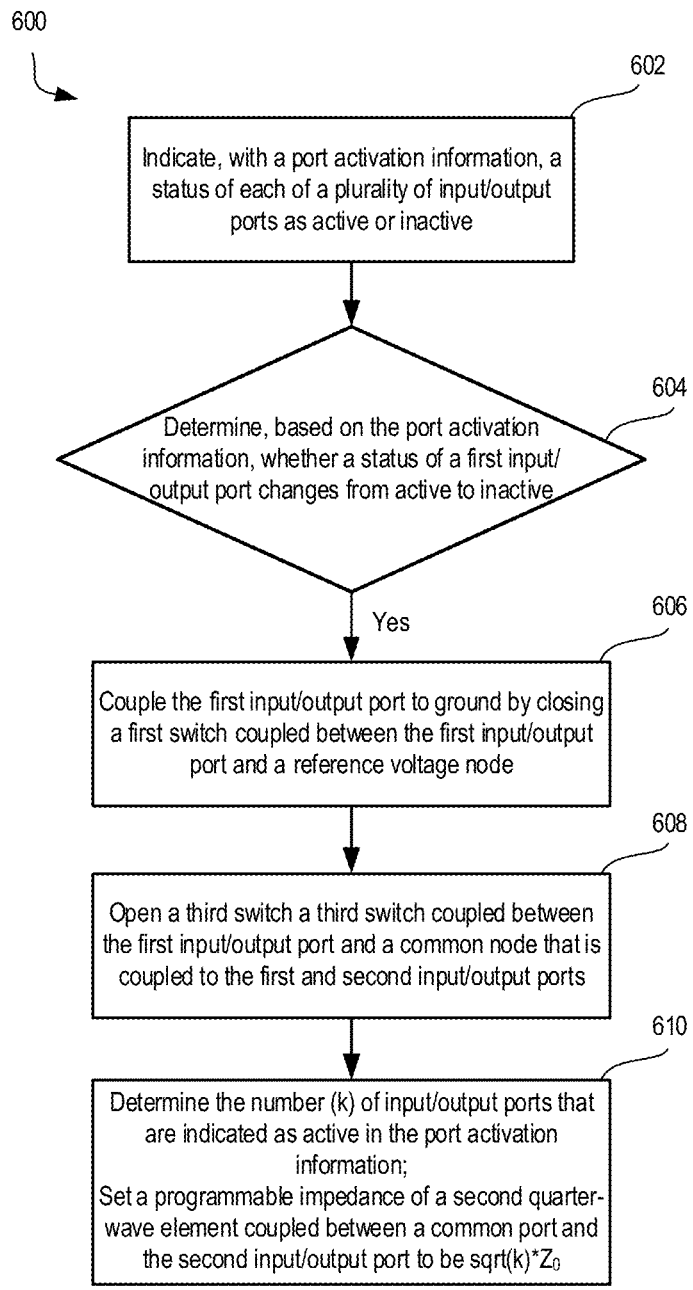
FIG. 6 is a flow chart of a method 600 of operating a power combiner/splitter as disclosed in the present application, in accordance with some embodiments.

FIG. 6 is a flow chart of a method 600 of operating a power combiner/splitter as disclosed in the present application, in accordance with some embodiments. As shown in FIG. 6, method 600 at act 602 indicates in a port activation information a status of each of a plurality of input/output ports. The status may be active, or inactive, for example as shown in the exemplary port activation information 482 in FIG. 4. At act 604, a determination is made based on the port activation information on whether a status of a first input/output port of a plurality of input/output ports changes its status from active to inactive, and if yes, method 600 comprises at act 606 coupling the first input/output port to a reference voltage node by closing a first switch coupled between the first input/output port and a reference voltage node. At act 608, method 600 comprises opening a third switch coupled between the first input/output port and a common node that is coupled to the first and second input/output ports. At act 610, a programmable impedance is set. The method first determines the number (k) of input/output ports that are indicated as active in the port activation information. The programmable impedance is an impedance of a second quarter-wave element coupled between a common port of the power combiner/splitter and the second input/output port. The programmable impedance is then set to be $Z=\sqrt{k}\, Z_0$. In some embodiments, controller 480 may be used to control the switching and adjustment of quarter-wave element programmable impedances. Controller 480 may comprise logic circuitry that selectively outputs control signals to control terminals of the switches and quarter-wave elements to perform the method in accordance with some embodiments. Controller 480 may be an integrated circuit (IC) disposed on a same device package as the power combiner/splitter, or it may be in a separate package.

Figure 7:
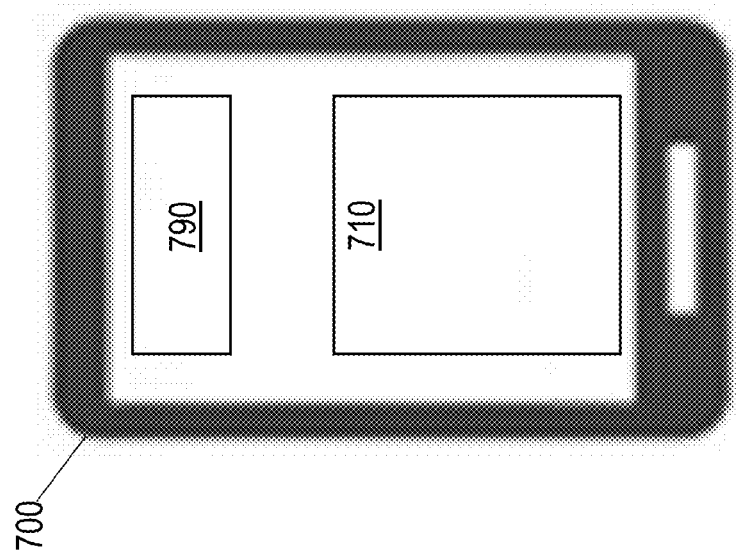
FIG. 7 is a schematic diagram of wireless communication device 700 that houses one or more power combiner/splitter devices of the types described herein.

FIG. 7 is a schematic diagram of a wireless communication device 700 that houses one or more power combiner/splitter devices of the types described herein. According to an aspect of the present application, power combiner/splitter devices 710 may be provided in consumer electronic devices such as the wireless communication device 700 as shown in FIG. 7 to couple with an antenna array 790 to split a transmission RF signal into multiple RF signals for transmission by the antenna array, or to combine multiple RF signals received by the antenna array into a measured RF signal. Wireless communication device 710 may be any device that includes multiple antennas for transmitting/receiving wireless signals. Examples of wireless communication device 710 include but are not limited to a mobile phone, a wireless display, a smart watch or other wearable devices that utilize wireless communication. Wireless communication device 710 is also not limited to a mobile device, and may be a wireless access point, a wireless router, a wireless repeater, a wireless base station, etc.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, while wireless communication devices are described, the programmable power combiner and splitter described in the present application is not limited for use in a communication device, and may be implemented in other devices such as radar, sonar, or medical imaging devices based on acoustic transmitter/receivers such as ultrasound imagers. Aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A power combiner/splitter comprising:
    a common port;
    a plurality of input/output ports including a first input/output port and a second input/output port, wherein the first and second input/output ports are coupled to a common node;
    a first quarter-wave element coupled between the common port and the first input/output port;
    a first switch coupled between the first input/output port and a reference voltage node;
    a second quarter-wave element coupled between the common port and the second input/output port;
    a second switch coupled between the second input/output port and the reference voltage node;
    a third switch coupled between the first input/output port and the common node;
    a fourth switch coupled between the second input/output port and the common node.

2. The power combiner/splitter of claim 1, wherein the first quarter-wave element comprises a quarter wave transmission line.

3. The power combiner/splitter of claim 1, wherein the first quarter-wave element comprises a lumped element circuit.

4. The power combiner/splitter of claim 1, wherein:
    each of the first and second quarter-wave elements has a programmable impedance.

5. The power combiner/splitter of claim 4, further comprising:
a first resistance coupled between the first input/output port and the common node and in series with the third switch;
a second resistance coupled between the second input/output port and the common node and in series with the fourth switch.

6. The power combiner/splitter of claim 5, wherein each of the first and second resistance equals a characteristic impedance $Z_0$.

7. The power combiner/splitter of claim 6, wherein $Z_0$ is in a range of 50 to 100 Ohm inclusive.

8. The power combiner/splitter of claim 6, further comprising a controller configured to close the first switch to connect the first input/output port to the reference voltage node in response to an indication in a port activation information that a status of the first input/output port changes from active to inactive.

9. The power combiner/splitter of claim 8, wherein the controller is further configured to open the third switch in response to the indication.

10. The power combiner/splitter of claim 8, wherein the controller is further configured to set the programmable impedance of the second quarter-wave element to sqrt(k)*$Z_0$, wherein k is a number of input/output ports that are indicated as active in the port activation information.

11. The power combiner/splitter of claim 1, wherein one or more of the plurality of input/output ports are coupled to an antenna array in a wireless communication device.

12. The power combiner/splitter of claim 1, wherein the reference voltage node is a ground node.

13. A method of operating a power combiner/splitter that has a common port and a plurality of input/output ports including a first input/output port and a second input/output port; a first quarter-wave element coupled between the common port and the first input/output port; a first switch coupled between the first input/output port and a reference voltage node; a second quarter-wave element coupled between the common port and the second input/output port; a second switch coupled between the second input/output port and the reference voltage node;
the method comprising:
indicating, with a port activation information, a status of each of the plurality of input/output ports as active or inactive;
determining, based on the port activation information, whether a status of the first input/output port changes from active to inactive;
in response to determining that the status of the first input/output port changes from active to inactive, coupling the first input/output port to the reference voltage node by closing the first switch, wherein
the power combiner/splitter further comprises a common node between the first and second input/output ports, a third switch coupled between the first input/output port and the common node, and a fourth switch coupled between the second input/output port and the common node, wherein the method further comprises:
in response to determining that the status of the first input/output port changes from active to inactive, opening the third switch.

14. The method of claim 13, wherein each of the first and second quarter-wave elements has a programmable impedance, and wherein the method further comprises:
in response to the determination that the status of the first input/output port changes from active to inactive:
determining a number (k) of input/output ports that are indicated as active in the port activation information; and
setting the programmable impedance of the second quarter-wave element to sqrt(k)*$Z_0$.

15. The method of claim 14, wherein the power combiner/splitter further comprises a first resistance coupled between the first input/output port and the common node and in series with the third switch, and a second resistance coupled between the second input/output port and the common node and in series with the fourth switch.

16. The method of claim 15, wherein the first and second resistance equals $Z_0$.

* * * * *